(12) United States Patent
Kimura et al.

(10) Patent No.: US 6,444,029 B1
(45) Date of Patent: Sep. 3, 2002

(54) MULTISTAGE SPIN TYPE SUBSTRATE PROCESSING SYSTEM

(75) Inventors: Yoshio Kimura, Kikuchi-gun; Issei Ueda, Kumamoto, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/338,544

(22) Filed: Jun. 23, 1999

(30) Foreign Application Priority Data

Jun. 24, 1998 (JP) .......................................... 10-177627

(51) Int. Cl.[7] .......................... B05C 11/00; B05C 11/02; B05C 5/00
(52) U.S. Cl. ............................ 118/52; 118/66; 118/321
(58) Field of Search ............................ 118/52, 66, 319, 118/321, 326; 396/611

(56) References Cited

U.S. PATENT DOCUMENTS

| | | | |
|---|---|---|---|
| 5,250,114 A | * 10/1993 | Konishi et al. ............. | 118/321 |
| 5,664,254 A | 9/1997 | Ohkura et al. | |
| 5,725,664 A | * 3/1998 | Nanbu et al. .................. | 118/52 |
| 6,004,047 A | * 12/1999 | Akimoto et al. ............ | 396/604 |
| 6,126,338 A | * 10/2000 | Akimoto ..................... | 396/611 |

* cited by examiner

*Primary Examiner*—Richard Crispino
*Assistant Examiner*—Kevin P Shortsle
(74) *Attorney, Agent, or Firm*—Rader, Fishman & Grauer, PLLC

(57) ABSTRACT

The system comprises a multistage spin unit having a plurality of compartments stacked vertically in a multistage, a main arm mechanism comprising a wafer holder and driving means for causing the wafer holder to advance and retreat longitudinally, moving the wafer holder up and down along a vertical shaft and turning the wafer holder around the vertical shaft, a spin chuck provided on each of the compartments for holding and spin-rotating the wafer delivered by the main arm mechanism, a cup for surrounding the spin chuck to receive and discharge a treatment solution separated from the substrate by centrifugal force, a shared nozzle for supplying the treatment solution toward the substrate held by the spin chuck in the compartment, a nozzle moving passageway provided along the multistage spin unit for communicating with each compartment to move the shared nozzle therethrough, and a nozzle moving mechanism for moving the shared nozzle.

8 Claims, 14 Drawing Sheets

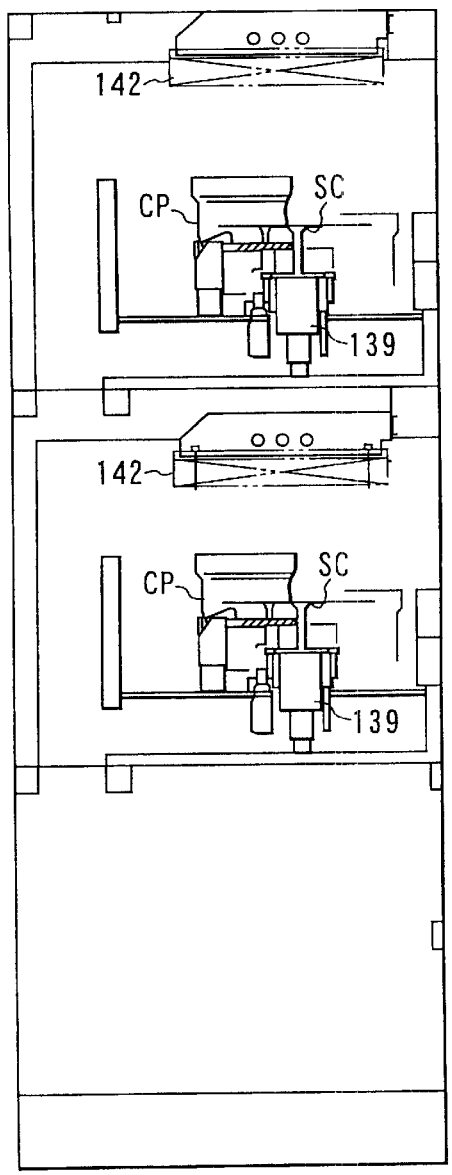
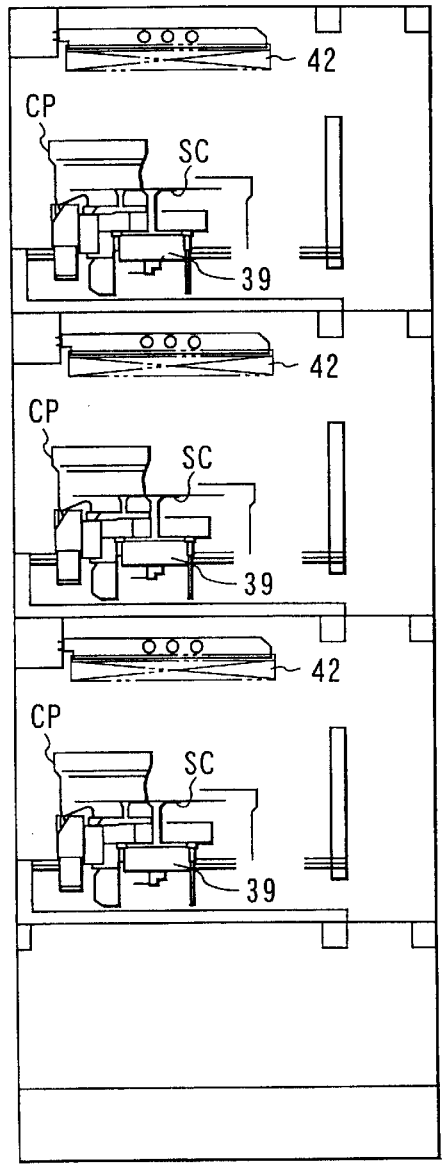
FIG. 7B
PRIOR ART
FIG. 7A

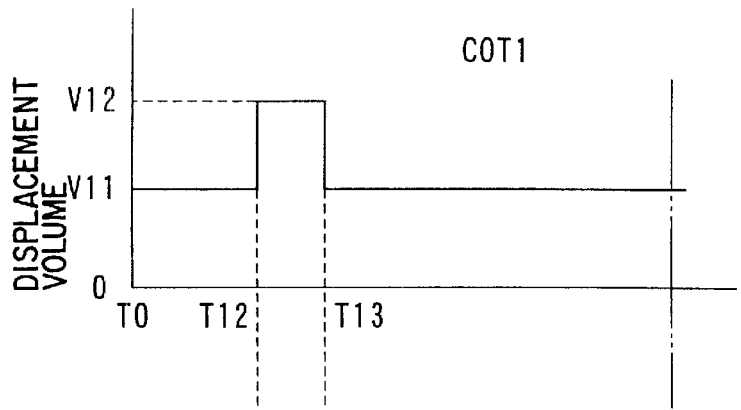
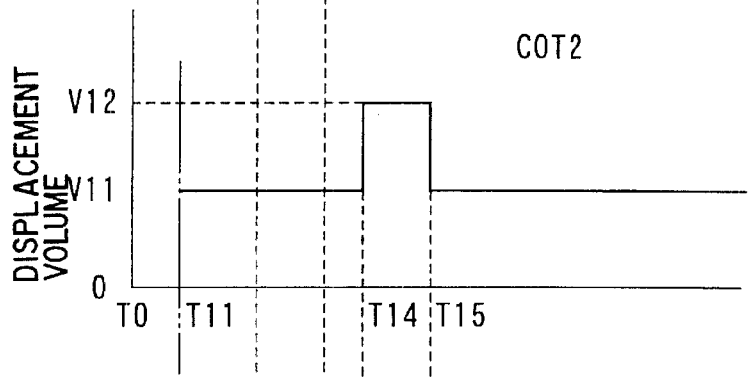
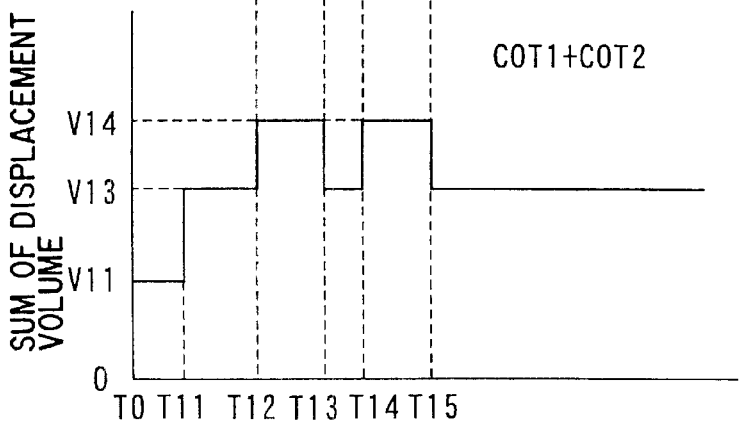

MULTISTAGE SPIN TYPE SUBSTRATE PROCESSING SYSTEM

BACKGROUND OF THE INVENTION

The present invention relates to a multistage spin type substrate processing system for applying a photoresist onto a substrate such as a semiconductor wafer and for developing the same.

In a photolithographic process for manufacturing a semiconductor device, a photoresist is applied onto a surface of a semiconductor wafer, and is pattern-exposed and developed. For such a series of substrate processes, for example, a substrate processing system disclosed in U.S. Pat. No. 5,664,254 is used.

As shown in FIGS. 1 and 2, a conventional substrate processing system 100 comprises a cassette station 110 having a first subarm mechanism 21, process sections 111, 112 and 113, each having a main arm mechanism 24, and an interface section 114 having a second subarm mechanism 26. As shown in FIG. 1, the main arm mechanism 24 is provided on the center of each of the first, second and third process sections 111, 112 and 113, and various processing device groups $G_1$ to $G_{15}$ are provided to surround the main arm mechanism 24 on all sides. Liquid treatment system processing device groups $G_1$ to $G_6$ are provided on the front side of the processing system 100, and heat treatment system processing device groups $G_7$ to $G_{15}$ are provided on the back side and the side face side of the processing system 100.

As shown in FIG. 2, each of the liquid treatment system processing device groups $G_1$ to $G_6$ comprise pairs of right and left units BCTs, COTs and DEVs stacked vertically in two stages. A spin rotation liquid treating device having a cup CP and a spin chuck SC is provided in each of the units BCT, COT and DEV. In order to prevent a contamination from being caused by sticking of particles and the like and to stabilize process performance during a liquid treatment, clean air having a temperature and a humidity controlled is introduced into each of the units BCT, COT and DEV, and air is forcibly discharged from each of the units BCT, COT and DEV.

In such a processing system 100, a wafer W is fetched from a cassette CR of the cassette station 110 by the first subarm mechanism 21 and is transferred to the main arm mechanism 24, a treating solution for a substrate reflection preventing film is applied onto the wafer W by the applying unit BCT in the first process section 111 and is baked, the resist solution is applied onto the wafer W by the applying unit COT provided in the second process section 112 and is baked, and the wafer W is further transferred to the second subarm mechanism 26, is delivered to an exposure system (not shown) through the interface section 114 and is subjected to an exposing treatment. Furthermore, the wafer W is delivered into the third process section 113 through the interface section 114, is baked (PEB) after the exposure, is subjected to a developing treatment by the developing unit DEV, and is rinsed, dried and finally returned to the cassette CR of the cassette station 110.

With an increase in the size of the wafer, a user has greatly desired an increase in the process number (a high throughput) per unit time in order to further enhance productivity. In a series of resist processes, however, the fineness of a circuit pattern has further been enhanced and the wafer size has further been increased and a time taken for each process step tends to be increased. Therefore, it has been hard to enhance the throughput. In order to obtain a clear pattern at a developing step, for example, it is also necessary to keep a developing time as long as possible. In a chemical amplification type photoresist, particularly, the same wafer W is repeatedly subjected to the developing process twice or three times in order to enhance a resolution during the development. For this reason, a long time is required for the process so that the throughput is easily lowered.

In step of applying and forming a reflection preventing film and a photoresist film on a wafer by a spin applying method, it is necessary to reduce a wafer rotating speed in order to achieve film thickness uniformity with an increase in a wafer diameter from 8 inches to 12 inches. Consequently, it takes too much time to shake a resist solution off and to perform a drying process. Consequently, the throughput tends to be reduced.

If another process section is further provided on the conventional substrate processing system 100 to enhance the throughput of the substrate process, the footprint (occupied floor space) of the device is increased. When the footprint of the device is increased, the total floor space of a clean room is necessarily increased, and an equipment investment and a running cost for controlling a clean room environment are excessively increased. For this reason, the user has greatly desired that the footprint of the device should be reduced as much as possible.

Furthermore, it is regulated that a distance between the floor of the clean room and a ceiling thereof should be equal to or smaller than 3.5 m. Therefore, it is necessary to make the height of the whole system smaller than an upper limit (3.5 m) of the height of the clean room. Within a range meeting the room height limiting conditions, the stacked conventional spin units have a limit of two stages. In order to further enhance the throughput of the resist applying and developing processes, a consumer has greatly desired that the spin units can be stacked in three stages or more.

BRIEF SUMMARY OF THE INVENTION

It is an object of the present invention to provide a multistage spin type substrate processing system which has a high throughput and a small footprint and meets the height limiting conditions of a clean room.

The present invention provides a multistage spin type substrate processing system comprising a multistage spin unit having a plurality of compartments stacked vertically in a multistage, a main arm mechanism comprising a holder for holding a processed substrate to put the processed substrate in and out of each of the compartments, and driving means for causing the holder to advance and retreat longitudinally, moving the holder up and down along a vertical shaft and turning the holder around the vertical shaft, a spin chuck provided on each of the compartments for holding and spin-rotating the substrate delivered by the main arm mechanism, a cup for surrounding the spin chuck to receive and discharge a treatment solution separated from the substrate by centrifugal force, a common nozzle for supplying the treatment solution toward the substrate held by the spin chuck in the compartment, a nozzle moving passageway provided along the multistage spin unit for communicating with the compartment to move the common nozzle therethrough, and a nozzle moving mechanism for moving the common nozzle.

The system according to the present invention aggregates more liquid treating devices having a spin rotating method into one multistage spin unit than that in the prior art. Therefore, the throughput of the liquid treatment can be enhanced. Furthermore, one nozzle is shared, or in common with, the liquid treating devices. Therefore, the size of each of the liquid treating devices is reduced. Consequently, the size of the device is reduced as a whole (particularly, the height of the device is reduced) and the footprint of the device in a clean room is further reduced. Furthermore, the spin rotating liquid treating section, the main arm mechanism section and heat treating section can be modularized respectively, and each of them can be divided into blocks to be delivered and assembled. Therefore, the device can be delivered into and installed in the clean room more easily than in the prior art. Furthermore, a multistage spin processing system device group (multistage spin unit) is arranged in a vertical line differently from the prior art in which it is arranged in two horizontal lines. Consequently, the main delivery arm mechanism and the multistage spin processing system device group arranged in a vertical one line can be caused to correspond to each other at a ratio of 1 to 1. In addition, a shift between the center of the main delivery arm mechanism and the cup center of the multistage spin processing system device group (multistage spin unit) is reduced so that the cup can be provided on the center of the compartment. Consequently, accessories can be provided symmetrically on the right and left in the cup so that the unit can be shared on the right and left.

In this case, it is preferred that the multistage spin unit should have compartments which are stacked vertically in at least two stages or more and the same process treating section such as a resist applying section, a treating section, a resist developing section or the like should be provided in each compartment. Thus, a liquid can be supplied to a plurality of treating sections by means of the same nozzle. Furthermore, since the same chemicals treatment is performed by the multistage spin unit, other chemicals atmosphere is not mixed so that safety can be kept.

Furthermore, it is preferred that a rinse nozzle for supplying a rinse solution to the substrate should be provided in the compartment. For example, in the case where the rinse nozzle is shared, excessive development and uneven development (defective development uniformity) are caused if a rinse starting timing is delayed after the development. Therefore, it is desirable that the rinse nozzle should be provided in each compartment. However, it is also possible to share one rinse nozzle between a plurality of developing devices for a liquid treatment which makes no troubles for the timing.

Moreover, it is preferred that the system should further comprise a clean air introducing mechanism provided in an upper portion of the compartment for introducing clean air having a temperature and humidity regulated every compartment, a dividing member having an opening formed for putting the common nozzle in and out and serving to divide the nozzle moving passageway from the compartment, and an exhaust mechanism for exhausting the nozzle moving passageway. Thus, the clean air is introduced downward into each compartment, flows into the nozzle moving passageway through the opening of the dividing member, that is, the access opening of the common nozzle, goes down in the nozzle moving passageway and is discharged downward. In this case, the nozzle moving passageway is divided from each compartment by the dividing member. Therefore, the air always flows from the opening to the moving passageway, and particles generated in the nozzle moving mechanism do not enter the compartment but can be efficiently discharged together with a downward flow of the clean air.

Furthermore, it is preferable that the system should further comprise a collecting drain device communicating with each of the cups through a drain passageway, and a collecting exhaust device communicating with the cup through an exhaust passageway. By discharging liquid and air from the cup belonging to the same multistage spin unit toward the collecting drain device and the collecting exhaust device, the piping structure of a drainage and exhaust system can be simplified so that the discharged substances can be managed all together. For this reason, it is desirable that the same chemicals treatment should be carried out in one multistage spin processing system device group (multistage spin unit).

Furthermore, it is preferred that the system should further comprise an opening/closing valve provided on the exhaust passageway and a controller for controlling an operation of the opening/closing valve in such a manner that exhaust timings of the cups do not overlap each other. Thus, a large number of cups are controllably exhausted so that a maximum instantaneous displacement is reduced and a load applied to the collecting exhaust device on the plant side can be relieved. In addition, an exhaust flow rate in the multistage spin processing system device group (multistage spin units) can be always kept constant by the controller and a supplied air volume is constant. Therefore, a pressure balance on the inside can be kept at a constant positive pressure. Consequently, it is possible to prevent a contamination from entering from the outside.

With reference to FIGS. 3A to 3C, an exhaust timing of a conventional resist applying treatment will be described below. In a first applying unit COT1, the exhaust of a cup CP is started at a time T0. On the other hand, the exhaust of the cup CP is started at a time T11 in a second supplying unit COT2. The exhaust starting timing time T11 of the COT2 is later than the exhaust starting timing time T0 of the COT1 by a predetermined time. At this time, a displacement V11 of the cup CP is small and constant. In the first applying unit COT1, the displacement of the cup CP is then increased from V11 to V12 at a time T12 that a resist solution is started to be discharged from the nozzle toward the wafer W. At times T12 to T14, the resist is applied onto the wafer W while exhausting the cup CP with a large displacement V12. After the time T14 is passed, the displacement of the cup CP is returned from V12 to V11. On the other hand, in the second applying unit COT2, the displacement of the cup CP is increased from V11 to V12 at the time T13 that the resist solution is started to be discharged from the nozzle toward the wafer W. At the times T13 to T15, the resist is applied onto the wafer W while exhausting the cup CP with the large displacement V12. After the time T15 is passed, the displacement of the cup CP is returned from V12 to V11. As shown in FIG. 3C, an exhaust period from the time T12 to the time T14 and a period from the time T13 to the time T15 partially overlap each other. For this reason, a maximum displacement V15 in the cap CP sometimes exceeds an exhaust capacity (maximum capability) of the collecting exhaust device. Therefore, it is hard to rapidly discharge a mist of the resist solution from the inside of the cup CP.

With reference to FIGS. 4A to 4C, the exhaust timing of a conventional developing treatment will be described below. In a first developing unit DEV1, the cup CP is exhausted for a period from a time T0 to a time T22 and a period from a time T24 to a time T28, and the exhaust of the cup CP is stopped for a period from the time T22 to the time T24. On the other hand, in a second developing unit DEV2, the cup CP is exhausted for a period from a time T21 to a time T23 and a period from a time T26 to a time T29, and the exhaust of the cup CP is stopped for a period from the time T23 to the time T26. At this time, each displacement V21 of the cup CP is small and constant.

In the first developing unit DEV1, a developing solution is started to be discharged from the nozzle toward the wafer W at the time T0, the discharge of the developing solution is stopped at the time T22, and a latent image pattern in a resist film is developed with the developing solution put on the wafer W (in a liquid filling state) for a period from the time T22 to the time T24 (an exhaust stopping period). Then, the discharge of pure water from the nozzle is started at the time T24, the wafer W is rinsed, and the discharge of the pure water from the nozzle is stopped at the time T28. A period from the time T0 to the time T25 is an effective developing treatment period.

On the other hand, in the second developing unit DEV2, the developing solution is started to be discharged from the nozzle toward the wafer W at the time T21, the discharge of the developing solution is stopped at the time T23, and a latent image pattern in a resist film is developed with the developing solution put on the wafer W (in the liquid filling state) for a period from the time T23 to the time T26 (the exhaust stopping period). Then, the discharge of pure water from the nozzle is started at the time T26, the wafer W is rinsed, and the discharge of the pure water from the nozzle is stopped at the time T29. A period from the time T21 to the time T27 is an effective developing treatment period.

As shown in FIG. 4C, the period from the time T0 to the time T22 and the period from the time T21 to the time T23 partially overlap each other. Moreover, the period from the time T24 to the time T28 and the period from the time T26 to the time T29 partially overlap each other. For this reason, a maximum displacement V22 in the cap CP sometimes exceeds the exhaust capacity (maximum capability) of the collecting exhaust device. Therefore, it is hard to rapidly discharge a mist of the developing solution from the inside of the cup CP.

It is preferred that a thin motor having a smaller vertical thickness than in the prior art should be used for the spin chuck. Even if a spin unit (compartment) having four stages is stacked vertically by using the thin motor, the whole height of the system can fully achieve an upper limit (3.5 m) of the height of a clean room. However, the thickness of the cup cannot be reduced. The reason is that the function of discharging a mist-like process solution from the inside of the cup is deteriorated if the height (depth) of the cup is reduced (becomes small) excessively. For this reason, the height (depth) of the cup cannot be reduced (become small) unnecessarily.

It is preferred that the nozzle moving mechanism should comprise an elevator mechanism for moving the shared nozzle along the nozzle moving passageway, and a swinging and turning mechanism for swinging and turning the common nozzle around a vertical shift. When the common nozzle goes up and down along the nozzle moving passageway to reach the front face of a target compartment in the multistage spin unit, it swings and turns and is inserted into the compartment through an opening.

Furthermore, it is preferred that the system should comprise a heating unit having a hot plate provided apart from the multistage spin unit for heating the substrate, and a cooling unit provided below the heating unit for cooling the substrate. It is preferred that these heat treating units should be constituted in a multistage and should be set to another module separated from the multistage spin processing system device group (multistage spin unit) in consideration of thermal effect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a perspective front view showing the multistage spin type substrate processing system according to the embodiment of the present invention; and FIG. 7B is a perspective front view showing the conventional substrate processing system;

FIGS. 16A to 16C are timing charts showing a resist applying treatment in the device according to the embodiment.

DETAILED DESCRIPTION OF THE INVENTION

Various preferred embodiments of the present invention will be described below with reference to the accompanying drawings.

Figure 5:
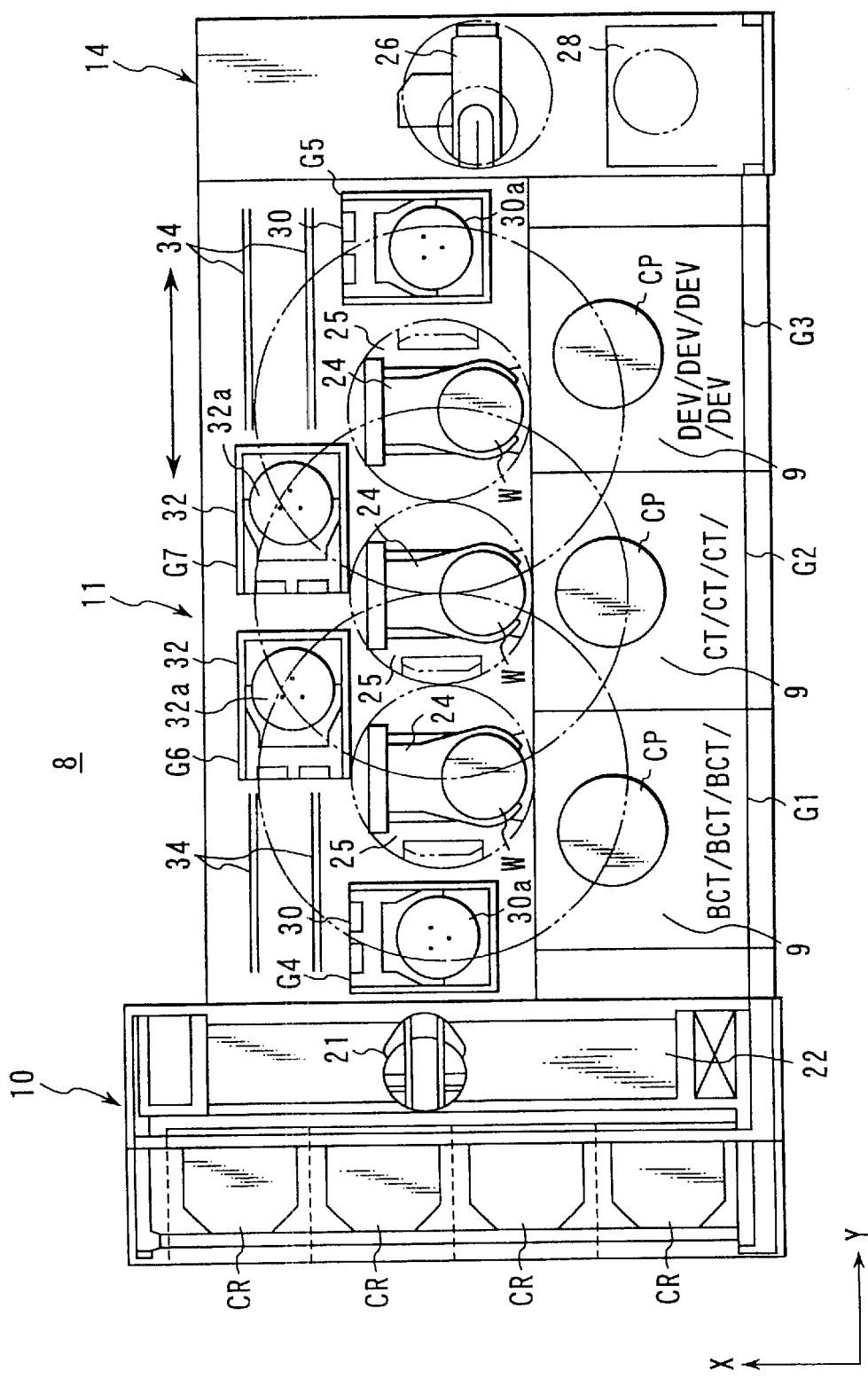
FIG. 5 is a perspective plan view showing a multistage spin type substrate processing system according to an embodiment of the present invention.
Figure 6:
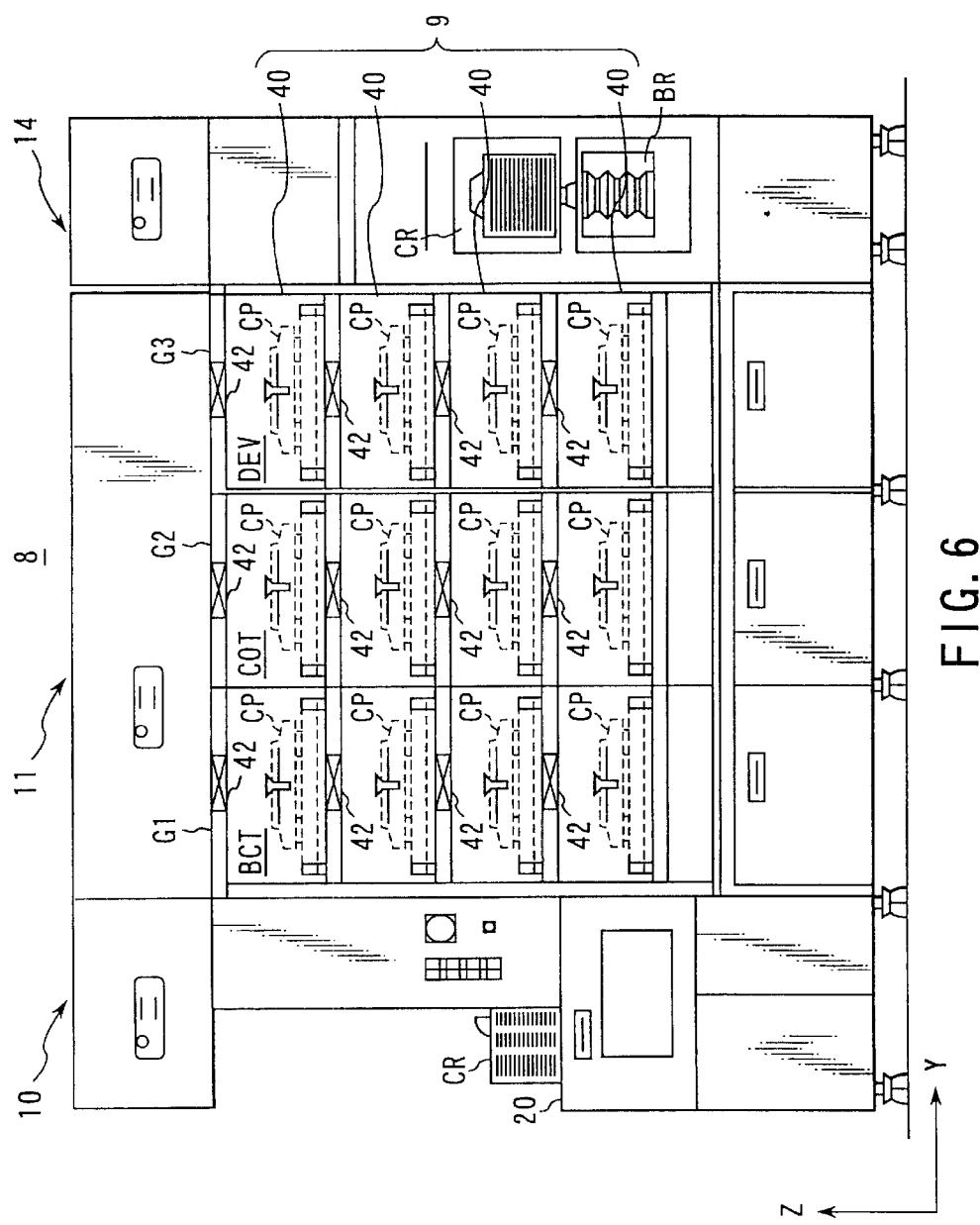
FIG. 6 is a perspective front view showing the multistage spin type substrate processing system according to the embodiment of the present invention.

As shown in FIGS. 5 and 6, a multistage spin type substrate processing system 8 comprises a cassette station 10, a process section 11, and an interface section 14. A wafer cassette CR is delivered into and out of the cassette station 10 by means of a delivery robot (not shown). Fifteen to twenty-five silicon wafers W having a diameter of 12 inches are housed in each cassette CR.

The cassette station 10 is provided with a mounting table 20 and a first subarm mechanism 21. Four cassettes CR are arranged and mounted on the mounting table 20 in the direction of an X-axis. The first subarm mechanism 21 comprises a holder for holding the wafer W and can run along a passageway 22 in the direction of the X-axis. The first subarm mechanism 21 comprises an alignment mechanism (not shown) for aligning the wafer W with respect to the process section 11.

Figure 1:
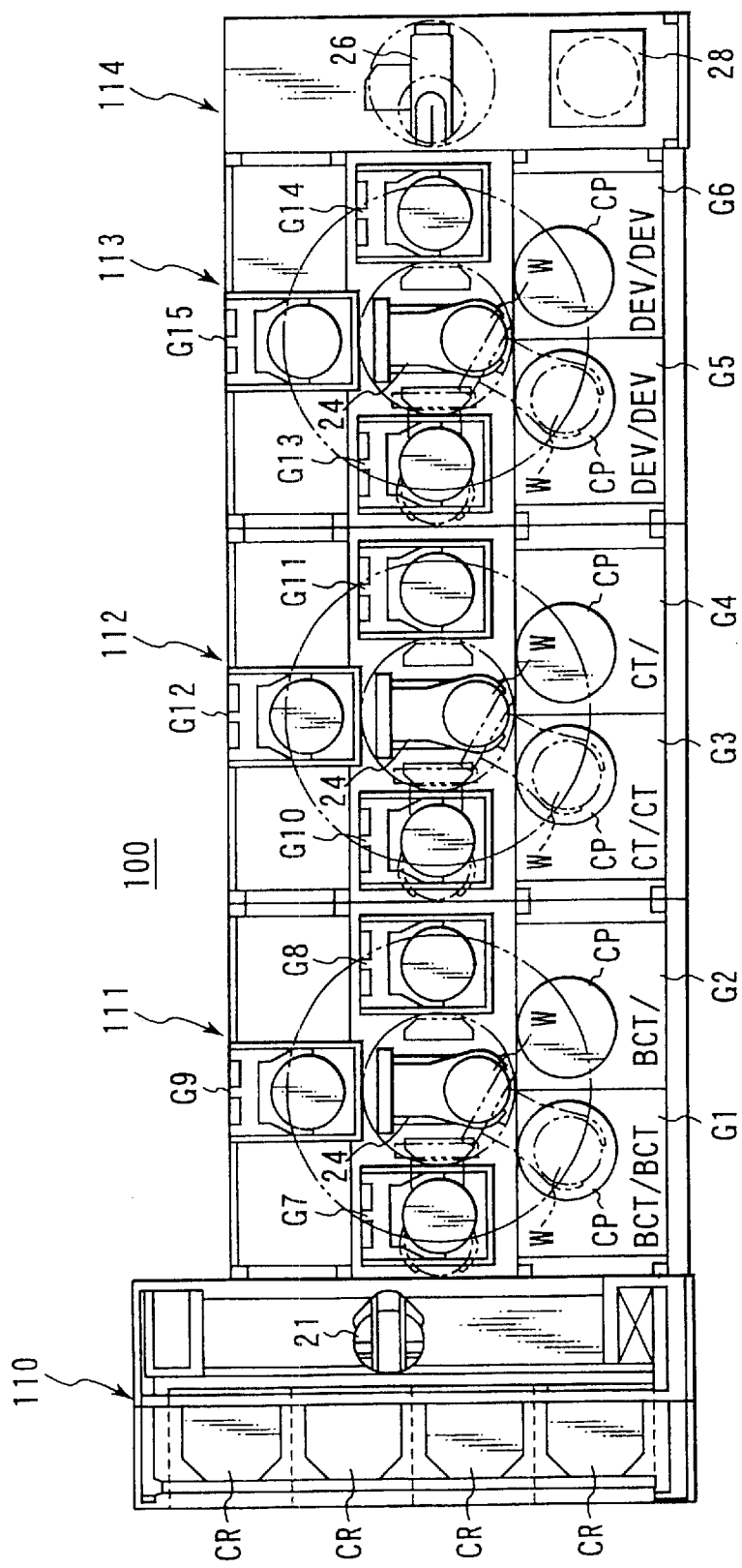
FIG. 1 is a plan view showing a conventional substrate processing system.
Figure 2:
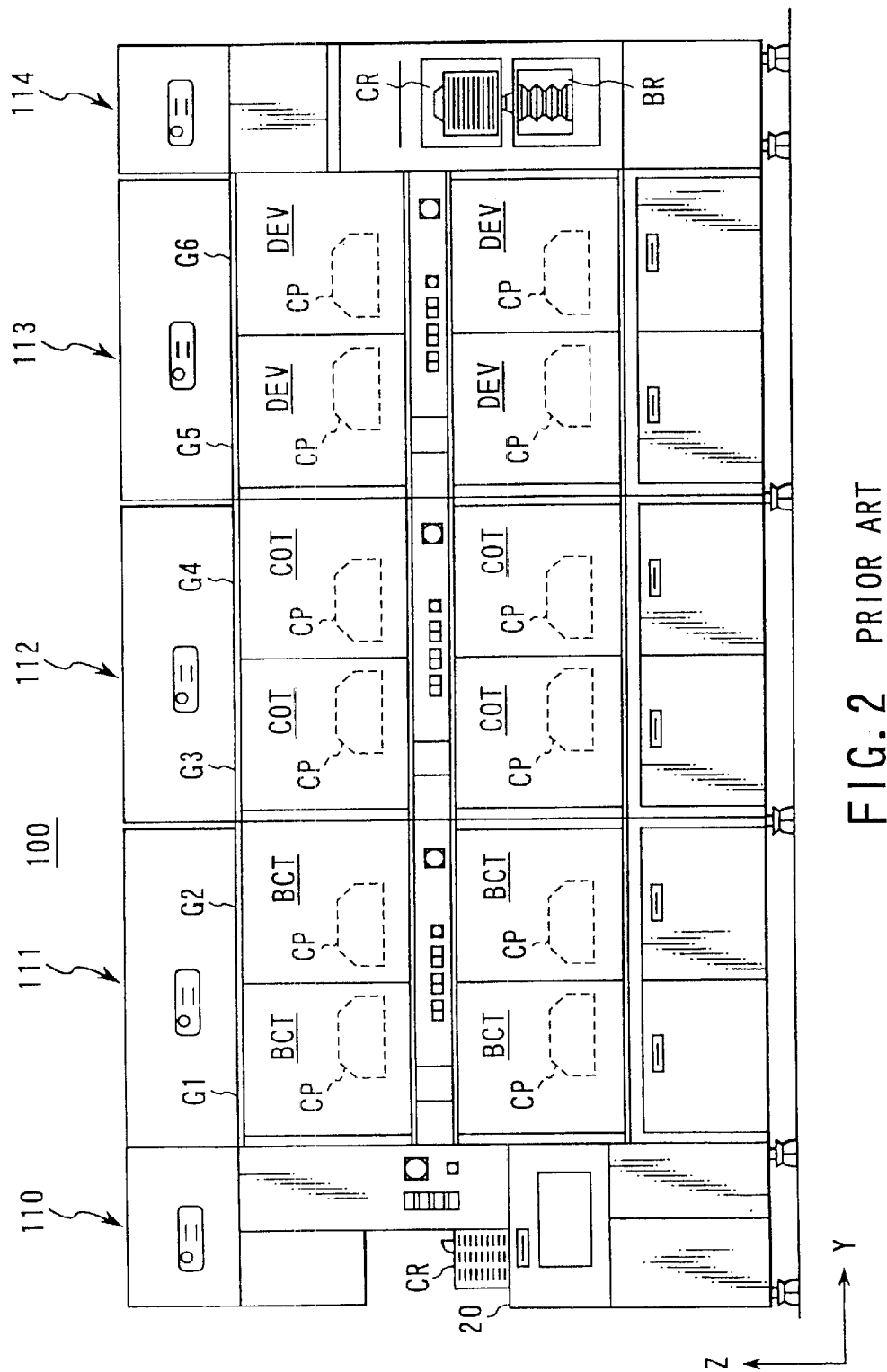
FIG. 2 is a front view showing the conventional substrate processing system.
Figure 3A:
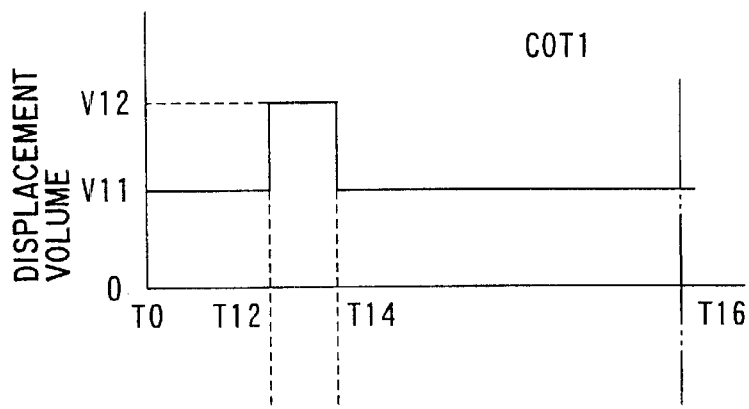
FIGS. 3A to 3C are timing charts showing a conventional resist applying treatment.
Figure 3B:
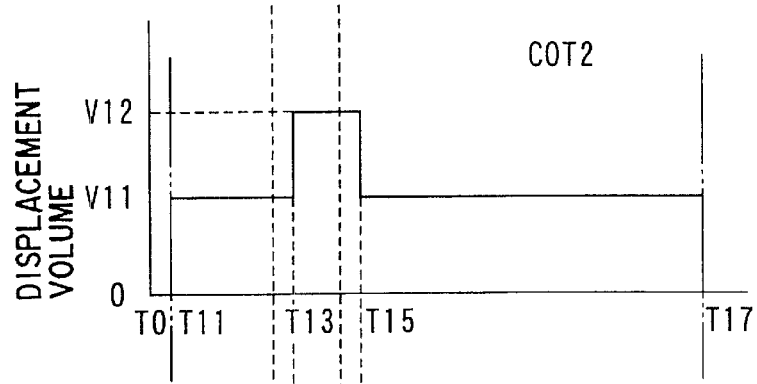
Figure 3C:
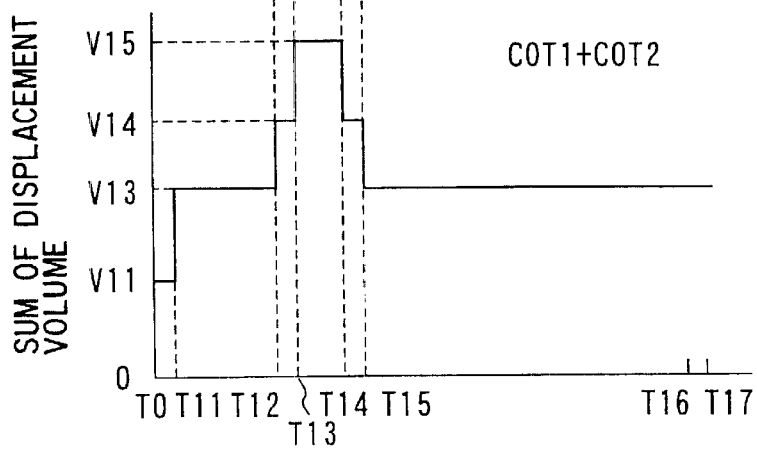
Figure 4A:
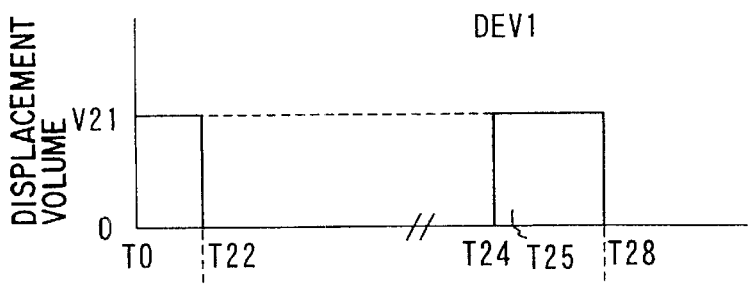
FIGS. 4A to 4C are timing charts showing a conventional developing treatment.
Figure 4B:
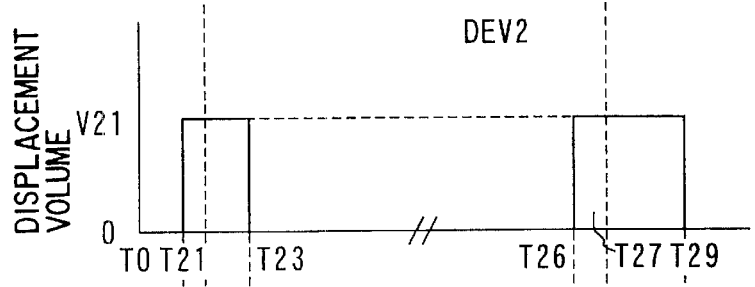
Figure 4C:
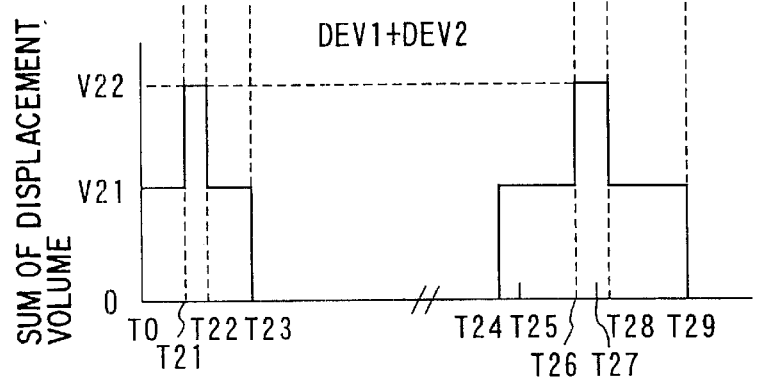

The process section 11 comprises three spin applying treating system groups $G_1$ to $G_3$, four heat treating system device groups $G_4$ to $G_7$, and three main arm mechanisms 24. As shown in FIG. 1, the three main arm mechanisms 24 are arranged on the center of the process section 11 in the direction of a Y-axis. Various processing device groups $G_1$ to $G_7$ are provided so as to surround these three main arm mechanisms 24 on all sides. The first, second and third spin rotating liquid treating system device groups $G_1$, $G_2$ and $G_3$ are provided on the front face side of the processing system 8, and the sixth and seventh heat treating system device groups $G_6$ and $G_7$ are provided on the back side. Furthermore, the fourth heat treating system device group $G_4$ is provided on the cassette station 20 side (one of side face sides of the processing system 8), and the fifth heat treating system device group $G_5$ is provided on the interface section 14 side (the other side face side of the processing system 8).

As shown in FIG. 6, the first, second and third spin applying treating system device groups $G_1$, $G_2$ and $G_3$ are provided adjacently to each other in this order, and comprise a multistage spin unit 9 having a compartment 40 stacked vertically in four stages respectively, for example. A applying device BCT for forming a reflection preventing film is provided in the compartment 40 of the first spin applying treating system device group $G_1$, an applying device COT for forming a photoresist film is provided in the compartment 40 of the second spin applying treating system device group $G_2$, and a developing device DEV for developing the pattern-exposed photoresist film is provided in the compartment 40 of the third spin applying treating system device group $G_3$.

An adhesion device for enhancing adhesion of a resist to a substrate, a baking device, a cooling device, an extension device for transferring the substrate between delivery arms, and a cleaning device are stacked vertically in a multistage on each of the four heat treating system device groups $G_4$ to $G_7$.

As shown in FIG. 5, the sixth and seventh heat treating system device groups $G_6$ and $G_7$ are provided movably in the direction of the Y-axis over a slide rail 34 provided on the back side of the processing system 8. When the device groups $G_6$ and $G_7$ are slid, a space for a maintenance work is kept to inspect the main arm mechanism 24 from the back side. Devices 30 and 32 of the heat treating system device groups $G_4$ to $G_7$ comprise hot plates or cold plates 30a and 32a respectively, and three lift pins are provided to project from the hot plates or cold plates 30a and 32a so that the wafer W is moved from the main arm mechanism 24 and the subarm mechanisms 21 and 26 and is mounted on the lift pin.

The main arm mechanism 24 comprises a holder portion having three arm holders 24a, 24b and 24c which directly hold the wafer W. Each of the arm holders 24a, 24b and 24c is supported by a driving mechanism (not shown) respectively, and is slid along a base (not shown) and separately advances or retreats in an X–Y plane. The base is supported by an elevator mechanism (not shown) through a vertical shaft (not shown) so that it can go up and down along a vertical passageway 25. Furthermore, the holder portion of the main arm mechanism 24 is supported by a θ rotation driving mechanism (not shown), and can perform θ rotation around the vertical shaft in the vertical passageway 25.

The interface section 14 is adjacent to an exposing device (not shown) for pattern-exposing the substrate applied onto the wafer W. The interface section 14 comprises a second subarm mechanism 26 and a buffer mechanism 28. A BR (buffer) for temporarily housing the standby wafer W or a cassette CR (cassette/carrier) to be usually used is mounted on the buffer mechanism 28. The second subarm mechanism 26 comprises a holder for holding the wafer W and can run along the passageway in the direction of the X-axis. The second arm mechanism 26 comprises an alignment mechanism (not shown) for aligning the wafer W with respect to the exposing device and the process section 11.

Figure 9:
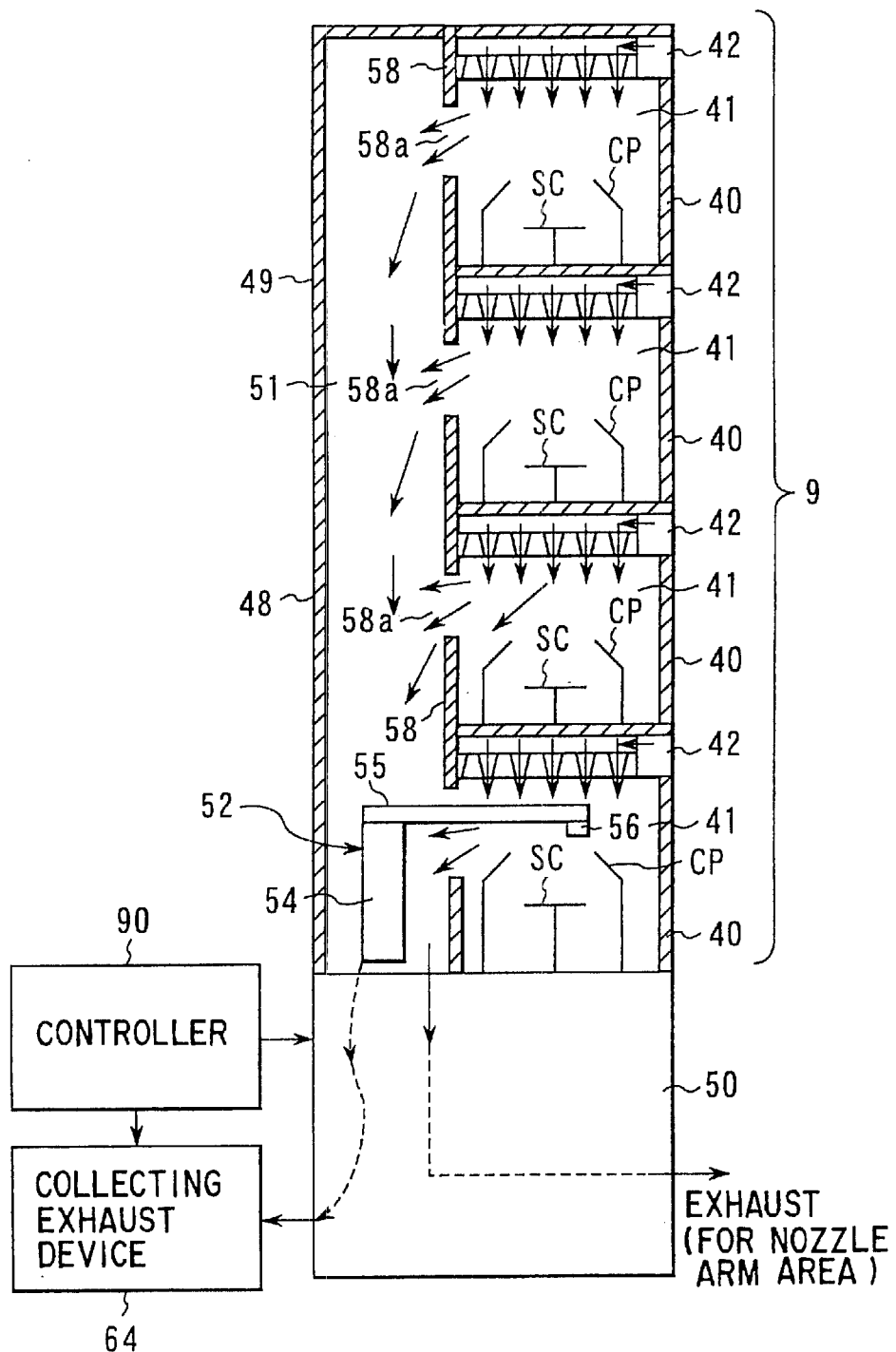
FIG. 9 is a typical view showing the outline of an air flow in the multistage spin unit and a nozzle moving passageway.

Various filters (not shown) are provided in the upper portion of the processing system 8. Clean air is supplied from a hygrothermal regulating air blower circuit (not shown) to each of the sections 10, 11 and 14 through the filters, respectively. As shown in FIGS. 6 and 9, the clean air is supplied into each compartment 40 of the multistage spin unit through another circuit (not shown). A temperature and humidity in each compartment 40 of the multistage spin unit are optimally controlled by a controller 90 or an independent controller. By the way, the clean air supplied to each compartment 40 is regulated within a range of ±0.1° C. with respect to a target temperature and within a range of ±0.5% with respect to a target humidity. The controller 90 controls each of operations of the devices belonging to the seven processing device groups $G_1$ to $G_7$, the three main arm mechanisms 24 and the two subarm mechanisms 21 and 26, respectively.

The comparison of the system according to the present invention to the system according to the prior art will be described below with reference to FIGS. 7A and 7B.

The distance between the floor of a clean room and the ceiling thereof has a limitation of about 3.5 m or less. Therefore, there has been a limit that two spin units are stacked in a conventional system 100 as shown in FIG. 7B. In a conventional device, a motor 139 for a spin chuck SC has a length (height) of about 170 mm, and a fan filter unit 142 has a height of about 140 mm.

To the contrary, three or four spin units can be stacked in the system 8 according to the present invention as shown in FIG. 7A. In the device according to the present invention, a motor 39 for a spin chuck SC has a length (height) of about 50 mm, and a fan filter unit 42 has a height of about 80 mm. Consequently, even if the multistage spin unit has three or four stages, the limit (3.5 m) of the height of the clean room can be achieved.

The third spin applying treating system device group $G_3$ having four developing devices DEV will be described below with reference to FIGS. 8 to 11.

Figure 8:
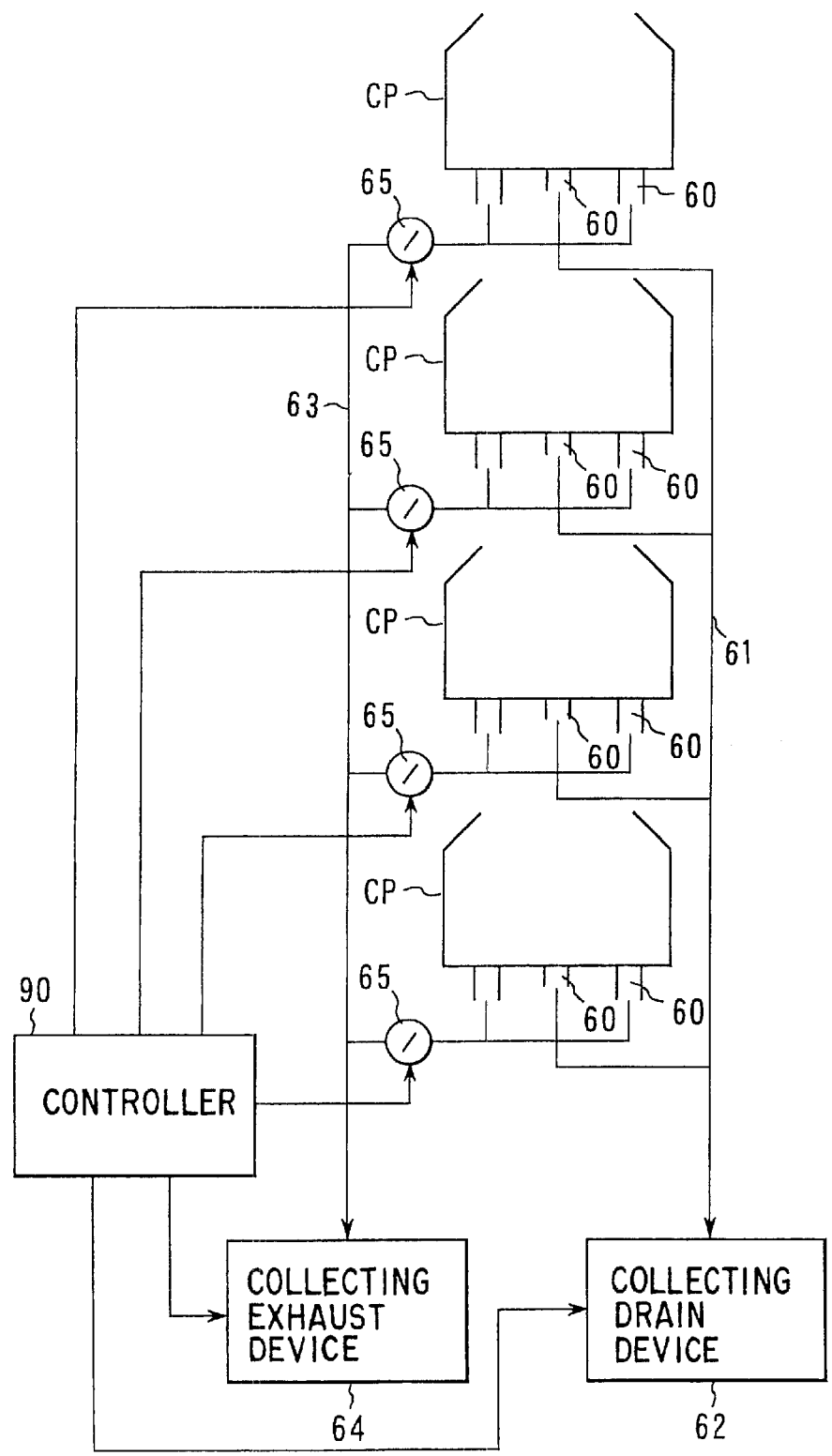
FIG. 8 is a block circuit diagram showing the outline of a discharging system of a multistage spin unit.

As shown in FIG. 8, four cups CP belonging to the multistage spin unit 9 having the same system have discharge systems unified. More specifically, a waste liquid flows out from the four cups CP to a collecting drain device 62 through a passageway 61 communicating with one bottom discharge port 60, and a mist or the like is forcibly exhausted from the four cups CP to a collecting exhaust device 64 through a passageway 63 communicating with the other bottom discharge port 60.

An opening/closing valve 65 is provided on the exhaust passageway 63 of the cup CP, and the controller 90 serves to control the timing of opening/closing operations of four opening/closing valves 65. More specifically, the operations of the opening/closing valves 65 are controlled respectively in such a manner that the exhaust timings of the four cups CP do not overlap one another. Consequently, the maximum instantaneous displacement of the collecting exhaust device 64 can be reduced so that a load thereof can be relieved.

As shown in FIG. 9, the multistage spin unit 9 and the common nozzle unit 49 are surrounded by an armor panel 48. A dividing member 58 is provided between the multistage spin unit 9 and the common nozzle unit 49. Both of them are divided by the dividing member 58. A nozzle moving passageway 51 is formed between the dividing member 58 and the armor panel 48. The common nozzle 52 is caused to go up and down in the nozzle moving passageway 51 by a nozzle moving mechanism 50. An opening 58a is formed on the dividing member 58, and an internal space 41 of each of the four compartments communicates with the nozzle moving passageway 51 through the opening 58a.

A clean air introducing mechanism 42 is provided in the upper portion of each compartment 40. Clean air is introduced into the internal space 41 for each compartment 40. A ULPA filter for cleaning air is built in the mechanism 42. The nozzle moving passageway 51 communicates with the collecting exhaust device 64 and is exhausted downward. The clean air is introduced downward into the internal space 41 of each compartment by means of the clean air introducing mechanism 42, flows into the nozzle moving passage 51 through the opening 48a of the dividing member, further goes down in the nozzle moving passageway 51, and is exhausted downward. In this case, the nozzle moving passageway 51 is divided from the internal space 41 of each compartment by the dividing member. Therefore, particles generated in the nozzle moving mechanism 50 enter the internal space 41 of the compartment with difficulty.

Figure 10:
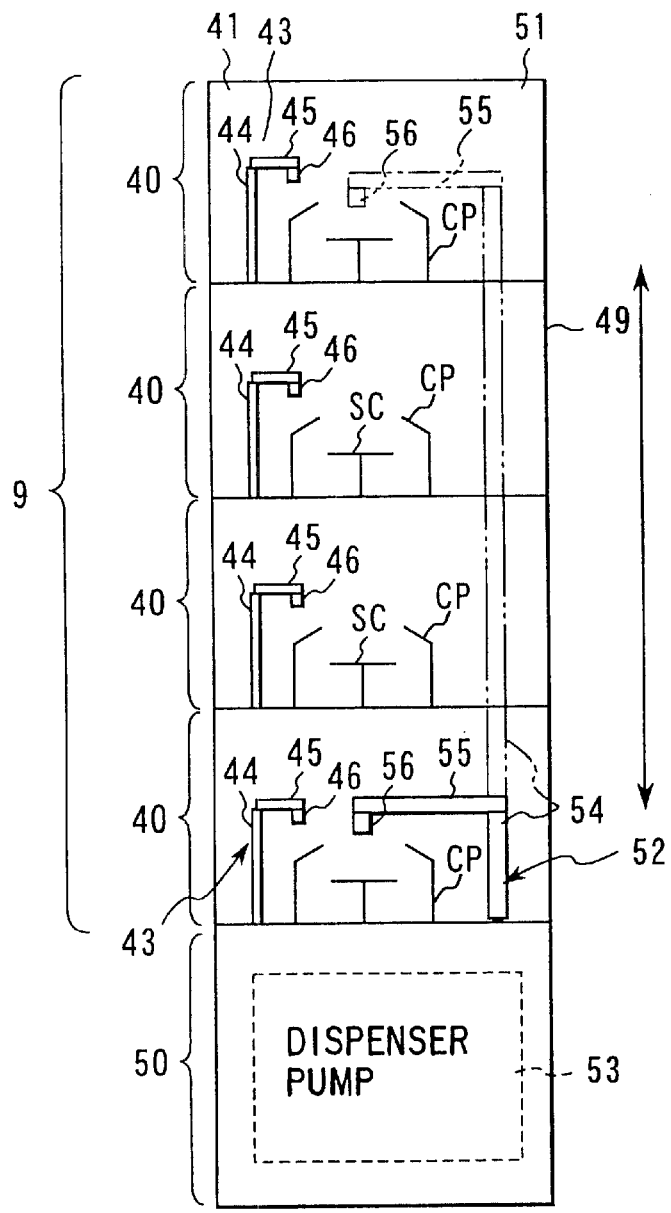
FIG. 10 is a perspective side view showing the outline of a common nozzle and a rinse nozzle.

As shown in FIG. 10, the common nozzle 52 is supported such that it can go up and down and be slid and turned by the nozzle moving mechanism 50. The supply flow path of the common nozzle 52 communicates with the flow path of a dispense pump mechanism 53. The common nozzle 52 comprises a vertical arm 54 having a lower end coupled to the driving portion of the nozzle moving mechanism 50, a horizontal arm 55 coupled to the upper end the of the vertical arm 54 and a liquid discharging section 56 attached to the tip of the horizontal arm 55.

A rinse nozzle 43 is provided for each compartment 40. A rinse solution (pure water) is sprayed on the wafer W over the spin chuck SC, and a developing solution is washed away from the wafer W. The rinse nozzle 43 comprises a vertical arm 44 having a lower end coupled to the driving portion of a nozzle moving mechanism (not shown), a horizontal arm 45 coupled to the upper end of the vertical arm 44 and a liquid discharging section 46 attached to the tip of the horizontal arm 45. The nozzle moving mechanism of the rinse nozzle 43 has a mechanism for sliding and turning the horizontal arm 45 around the vertical arm 44.

Figure 11:
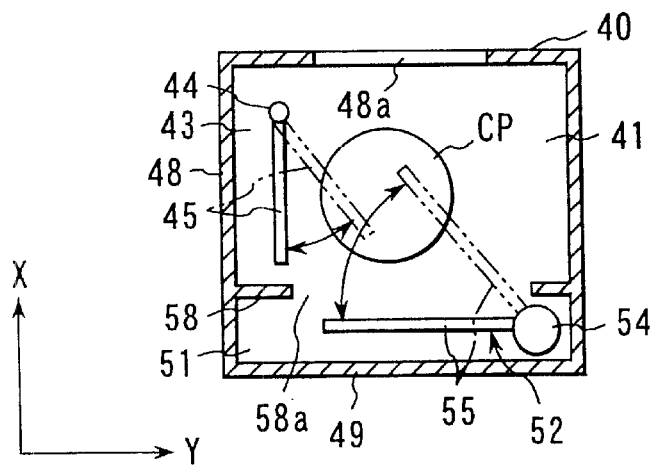
FIG. 11 is a perspective plan view showing the outline of the common nozzle and the rinse nozzle.

As shown in FIG. 11, the rinse nozzle 43 is provided in the vicinity of a wafer inserting port 48a, and the liquid discharging section 46 can be moved from a standby position on the outside of the cup CP to a use position placed just above the cup CP. Furthermore, the liquid discharging section 56 of the shared nozzle 52 can be moved from the standby position of the nozzle moving passageway 51 to the use position placed just above the cup CP through the opening 58a of the dividing member 58.

Figure 12:
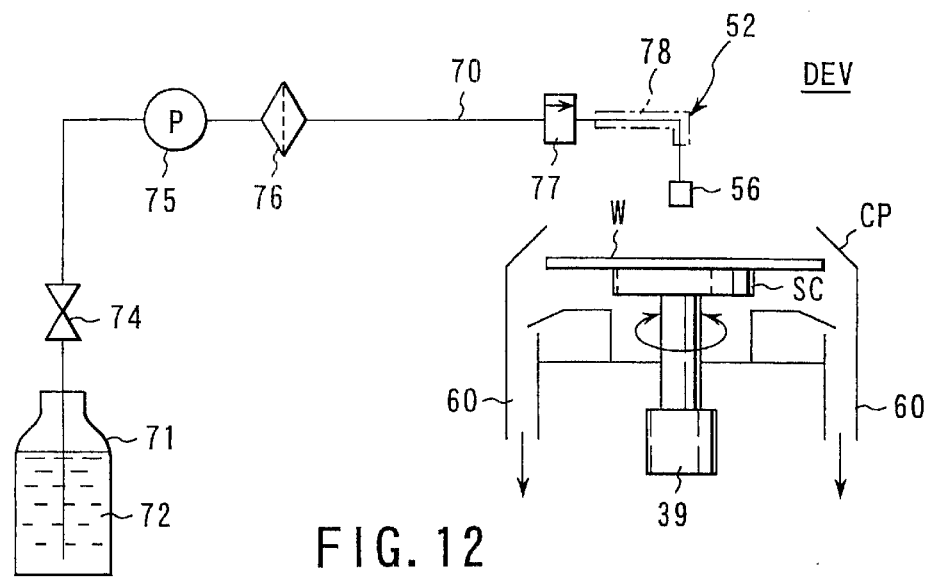
FIG. 12 is a block circuit diagram showing the outline of a developing device.

Next, the outline of the developing device DEV will be described below with reference to FIG. 12.

The common nozzle 52 of the developing device DEV communicates with a tank 71 through a liquid supply circuit 70. A developing solution 72 is stored in the tank 71. The liquid supply circuit 70 is provided with a valve 74, a pump 75, a filter 76, an air operate valve 77 and a temperature regulating mechanism 78 in this order. The developing solution 72 regulated to a predetermined temperature with a predetermined flow rate is discharged from the liquid discharging section 56 toward the wafer W provided on the spin chuck SD. A drive motor 39 of the spin chuck SC has a height of about 50 mm and a diameter of about 120 mm. The motor 39 is driven and controlled by the controller 90.

Figure 13:
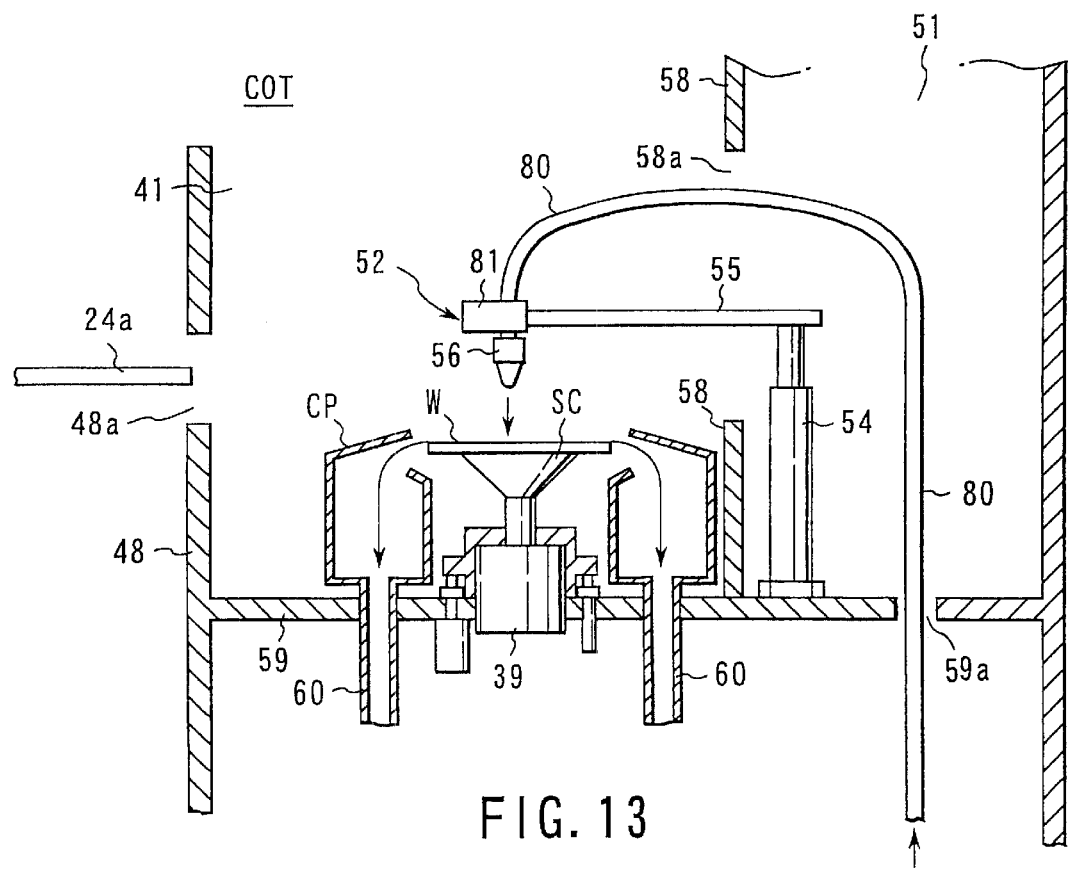
FIG. 13 is a longitudinal sectional view showing the outline of an applying device.

Next, the outline of the resist applying device COT will be described with reference to FIG. 13.

The holder 24a of the main arm mechanism 24 is inserted into each compartment 40 through the wafer inserting port 48a so that the wafer W is moved and mounted onto the spin chuck SC. Furthermore, it is desired that a shutter (not shown) should be provided on the wafer inserting port in order to prevent a contamination from being caused on the delivery arm side.

The common nozzle 52 of the applying device COT communicates with a resist supply source (not shown) through a flexible tube 80. The flexible tube 80 is introduced into the nozzle moving passageway 51 through a through hole 59a of a compartment floor plate 59. The liquid discharging section 56 is attached to the end of the flexible tube 80. A resist solution regulated to a predetermined flow rate, a predetermined temperature and a predetermined concentration is discharged from the liquid discharging section 56 toward the wafer W on the spin chuck SC. Numeral 81 denotes a temperature regulating section for regulating a temperature of the resist solution. In addition, the drive motor 39 of the spin chuck SC is substantially the same as that of the developing device DEV.

Figure 14:
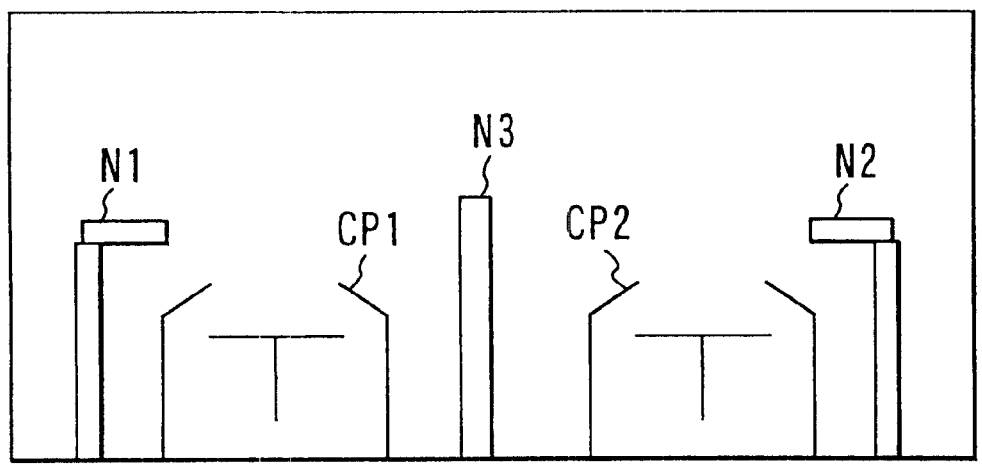
FIG. 14 is a perspective front view showing the outing of a common nozzle in a device according to another embodiment.
Figure 15:
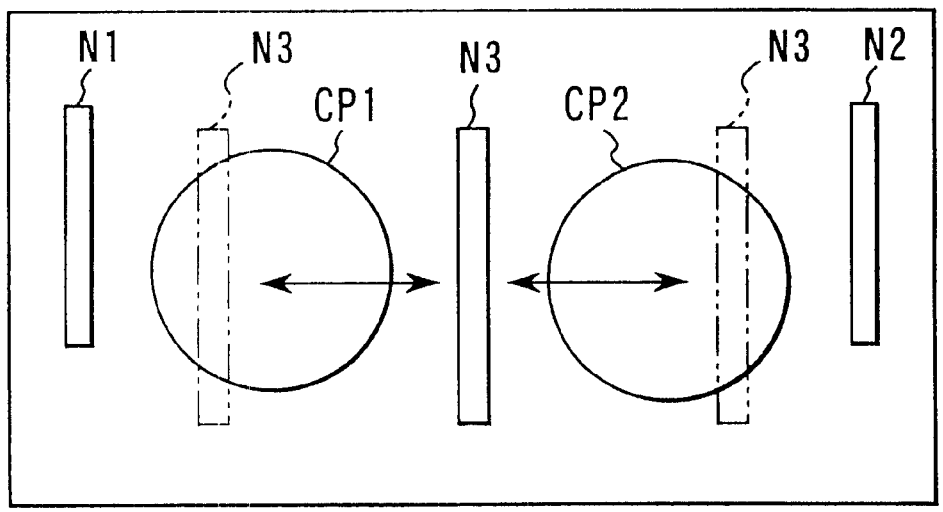
FIG. 15 is a perspective plan view showing the outline of the common nozzle in the device according to another embodiment.

As shown in FIGS. 14 and 15, in addition to a first nozzle N1 special for the first cup CP1 and a second nozzle N2 special for a second cup CP2, a third nozzle N3 which is horizontally movable may be provided between the first and second cups CP1 and CP2 such that the third nozzle N3 can be shared between the two cups CP1 and CP2 which are adjacent to each other.

Next, the case where the wafer W is processed by using the above-mentioned multistage spin type substrate processing system 8 will be described.

The first subarm mechanism 21 fetches the wafer W from the cassette CR and delivers the wafer W into an extension unit EXT of the fourth processing device group $G_4$. The first main arm mechanism 24 delivers the wafer W from the extension unit EXT and delivers the wafer W into an adhesion unit AD of the fourth processing device group $G_4$. Under heating, HMDS vapor acts to perform a hydrophobic treatment on the surface of the wafer W. In the cooling unit COL, the wafer W is cooled to a room temperature, is delivered into the applying unit BCT of the first processing device group $G_1$, and discharges a treatment solution for a reflection preventing film from the shared nozzle 52 while spin-rotating the wafer W by means of the spin chuck SC, thereby forming a reflection preventing film by application.

Then, the wafer W is delivered into the baking unit HOT of the sixth processing device group $G_6$, thereby baking the applied film.

Next, the wafer W is delivered into the cooling unit COL of the sixth processing device group $G_6$ by means of the first main arm mechanism 24 to perform cooling down to the room temperature, and the wafer W is then delivered from the second main arm mechanism 24. The second main arm mechanism 24 is delivered into the application compartment COT of the second processing device group $G_2$. The cup CP is started to be exhausted, and the resist solution is discharged from the common nozzle 52 while spin-rotating the wafer W by means of the spin chuck SC. Thus, a photoresist film is applied and formed on the top face of the wafer W.

With reference to FIGS. 16A to 16C, an exhaust timing of a resist applying treatment will be described below. In a first applying unit COT1, the exhaust of the cup CP is started at a time T0. On the other hand, the exhaust of the cup CP is started at a time T11 in a second applying unit COT2. The exhaust starting timing time T11 of the COT2 is later than the exhaust starting timing time T0 of the COT1 by a predetermined time. At this time, a displacement V11 of the cup CP is small and constant. In the first applying unit COT1, the displacement of the cup CP is then increased from V11 to V12 at a time T12 that a resist solution is started to be discharged from the nozzle 56 toward the wafer W. The displacement V12 is about twice as large as the first displacement V11, for example. At times T12 to T13, the resist is applied onto the wafer W while exhausting the cup CP with a large displacement V12. After the time T13 is passed, the displacement of the cup CP is returned from V12 to V11.

On the other hand, in the second applying unit COT2, the displacement of the cup CP is increased from V11 to V12 at the time T14 that the resist solution is started to be discharged from the nozzle 56 toward the wafer W. The displacement V12 is about twice as large as the first displacement V11, for example. At the times T14 to T15, the resist is applied onto the wafer W while exhausting the cup CP with the large displacement V12. After the time T15 is passed, the displacement of the cup CP is returned from V12 to V11.

As shown in FIG. 16C, the controller 90 controls the exhaust timing in such a manner that a period from the time T12 to the time T13 and a period from the time T14 to the time T15 do not overlap each other. For this reason, a maximum displacement V14 in the cap CP is limited to about three times as large as the displacement V11 obtained during non-application so that an exhaust capacity (maximum capability) of the collecting exhaust device 64 is not exceeded. Accordingly, both the first and second applying units COT1 and COT2 can keep full displacements and a mist of the resist solution can rapidly be discharged from the respective cups CP. While the two applying units COT1 and COT2 have been described above, the exhaust timing of three or more resist applying units can also be controlled in the same manner.

Then, the wafer W is delivered into the baking unit HP of the seventh processing device group $G_7$ to bake the applied film.

The wafer W is delivered from the baking unit HT by the third main arm mechanism 24, is delivered into the cooling unit COL of the fifth processing device group $G_5$ and is cooled to about a room temperature, and is then delivered out by the second subarm mechanism 26. Furthermore, the second subarm mechanism 26 mounts the wafer W on the mounting table of the interface section 14. Then, a carrier mechanism (not shown) on the exposing device side fetches the wafer W from the mounting table of the interface section 14 and delivers the wafer W into the exposing device (not shown) to perform an exposing treatment. After the exposing treatment, the carrier mechanism (not shown) mounts the wafer on the mounting table of the interface section 14 again. The second subarm mechanism 26 fetches the wafer W from the mounting table of the interface section 14, and transfers the wafer W to the third main arm mechanism 24 through the extension unit EXT of the fifth processing device group $G_5$.

Subsequently, the third main arm mechanism 24 delivers the wafer W to the baking unit HP of the seventh processing device group $G_7$ and executes a post-exposure baking (PEB) treatment. After the wafer W is cooled to about the room temperature in the cooling unit COL, it is delivered into the developing compartment DEV of the third processing device group $G_3$. The developing solution is discharged from the shared nozzle 52 while spin-rotating the wafer W by means of the spin chuck SC. Consequently, the pattern-exposed photoresist film is developed.

Figure 17A:
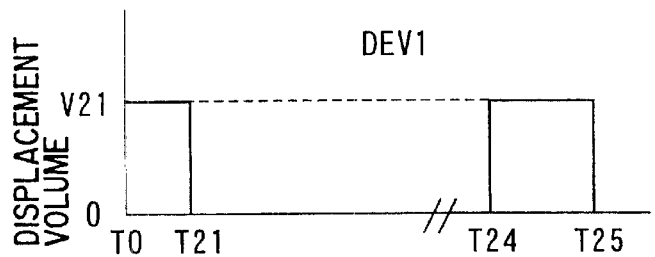
FIGS. 17A to 17C are timing charts showing a developing treatment in the device according to the embodiment.
Figure 17B:
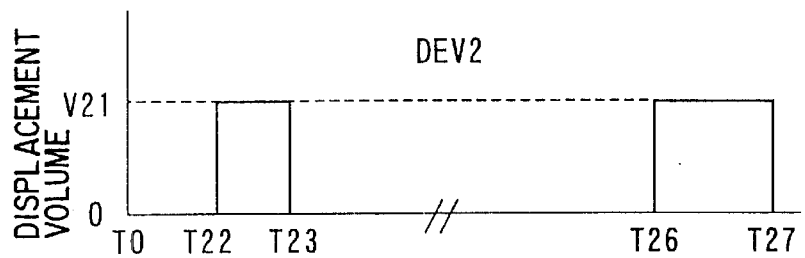
Figure 17C:
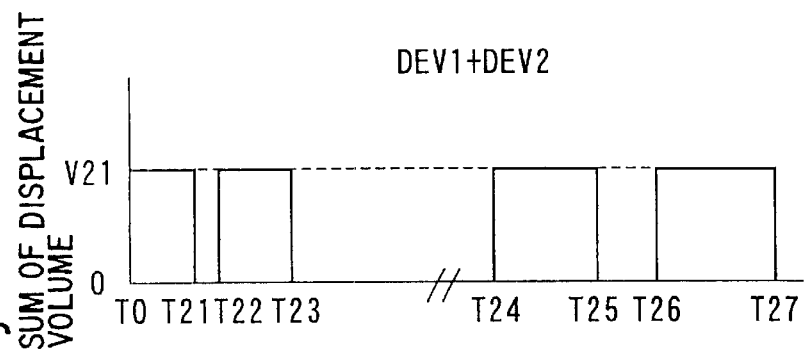

With reference to FIGS. 17A to 17C, the exhaust timing of a developing treatment will be described below. In a first developing unit DEV1, the cup CP is exhausted for a period from a time T0 to a time T21 and a period from a time T24 to a time T25, and the exhaust of the cup CP is stopped for a period from the time T21 to the time T24. On the other hand, in a second developing unit DEV2, the cup CP is exhausted for a period from a time T22 to a time T23 and a period from a time T26 to a time T27, and the exhaust of the cup CP is stopped for a period from the time T23 to the time T26. The exhaust starting timing time T22 of the DEV2 is later than the exhaust starting timing time T0 of the DEV1 by a predetermined time. At this time, each displacement V21 of the cup CP is small and constant.

In the first developing unit DEV1, a developing solution is started to be discharged from the nozzle 56 toward the wafer W at the time T0, the discharge of the developing solution is stopped at the time T21, and a latent image pattern in a resist film is developed with the developing solution put on the wafer W (in a liquid filling state) for a period from the time T21 to the time T24 (an exhaust stopping period). Then, the discharge of pure water is started from the nozzle 46 at the time T24, the wafer W is rinsed, and the discharge of the pure water from the nozzle 46 is stopped at the time T25.

On the other hand, in the second developing unit DEV2, the developing solution is started to be discharged from the nozzle 56 toward the wafer W at the time T22, the discharge of the developing solution is stopped at the time T23, and a latent image pattern in a resist film is developed with the developing solution put on the wafer W (in the liquid filling state) for a period from the time T23 to the time T26 (the exhaust stopping period). Then, the discharge of pure water from the nozzle 46 is started at the time T26, the wafer W is rinsed, and the discharge of the pure water from the nozzle 46 is stopped at the time T27.

As shown in FIG. 17C, the controller 90 controls the exhaust timing in such a manner that a period from the time T0 to the time T21 and a period from the time T22 to the time T23 do not overlap each other. In addition, the controller 90 controls the exhaust timing in such a manner that a period from the time T24 to the time T25 and a period from the time T26 to the time T27 do not overlap each other. For this reason, a maximum displacement V21 in the cap CP is reduced so that an exhaust capacity (maximum capability) of the collecting exhaust device 64 is not exceeded. Accordingly, both the first and second developing units DEV1 and DEV2 can keep full displacements and a mist of the developing solution can rapidly be discharged from the respective cups CP. While the two developing units DEV1 and DEV2 have been described above, the exhaust timings of three or more developing units can also be performed in the same manner.

After the development, pure water is discharged from the rinse nozzle 43 and the developing solution is washed away from the wafer W. Furthermore, the spin chuck SC is rotated at a high speed to centrifugally remove the stuck solution from the wafer W. The same solution is heated and dried by delivering the wafer W into the baking unit HP of the seventh processing device group $G_7$. The wafer W is cooled to about the room temperature, and is transferred from the main arm mechanism 24 to the first subarm mechanism 21 through an extension/cooling unit EXT/COL. Finally, the processed wafer W is returned into the cassette CR by means of the first subarm mechanism 21. A series of substrate processings described above are performed for a plurality of wafers W in the processing system 8 at the same time.

While the multistage spin unit provided in a vertical line has comprised the compartments stacked vertically in four stages in the present embodiment, the present invention is not limited thereto but the compartments may be stacked in two, three or five stages.

While the developing unit has been described in the present embodiment, the present invention is not limited thereto, it can also be applied to a resist applying unit and a reflection preventing film applying unit.

According to the present invention, more liquid treating devices having a spin rotating method are aggregated into one multistage spin unit than in the prior art. Therefore, the high throughput of the liquid treatment can be achieved. Furthermore, since one shared nozzle is shared among a large number of liquid treating devices, the space of each of the liquid treating devices (members) is reduced. Consequently, the size of the device is reduced as a whole and the footprint of the device in the clean room can further be reduced to 60 to 70% of the prior art. Moreover, the spin rotating liquid treating section, the main arm mechanism section and the heat treating section can be modularized respectively, and each of them can be divided into blocks to be delivered and assembled. Therefore, the device can be delivered to and installed in the clean room more easily.

Furthermore, the multistage spin unit is arranged in a vertical line differently from the prior art in which it is arranged in two vertical lines. Consequently, the main arm mechanism and the multistage spin unit can be opposed to each other at a ratio of 1 to 1, and the arm can be extended straight from the main arm mechanism toward the substrate inserting port of each compartment. Thus, the substrate can be delivered into and out of the compartment at a minimum distance without generating a dead space.

According to the present invention, if the footprint is the same as in the prior art, the number of the process sections can be increased from 2 to 4. Consequently, the processing throughput can remarkably be enhanced.

According to the present invention, the clean air is introduced downward into each compartment, flows into the nozzle moving passageway through the opening of the dividing member, goes down in the nozzle moving passageway and is discharged downward. In this case, the nozzle moving passageway is divided from each compartment by the dividing member. Therefore, particles generated in the nozzle moving mechanism do not enter the compartment and can be efficiently exhausted together with a downward flow of the clean air.

According to the present invention, the liquid and the air are discharged from the cup belonging to the same multistage spin unit toward the collecting drain device and the collecting exhaust device. Consequently, a drainage and exhaust system piping structure can be simplified and the discharged substances can be managed all together.

According to the present invention, by controlling the exhaust of a large number of cups belonging to the same multistage spin unit, the maximum instantaneous displacement of the multistage spin unit can be reduced so that a load applied to the collecting exhaust device on the plant side can be relieved.

According to the present invention, furthermore, by employing the thin unit having a smaller vertical thickness than in the conventional spin applying unit, about four stages can also be implemented within the limit (about 3.5 m) of the height of the clean room. Thus, the footprint of the device can be reduced.

According to the present invention, moreover, the shared nozzle is shared in the multistage spin units. As a result, the size of the spin applying unit can be reduced and the footprint of the device can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multistage spin type substrate processing system comprising:

a multistage spin unit having at least three compartments stacked vertically in a multistage;

a main arm mechanism comprising a holder for holding a processed substrate to put the processed substrate in and out of each of the compartments, and driving means for causing the holder to advance and retreat longitudinally, moving the holder up and down along a vertical shaft and turning the holder around the vertical shaft;

a spin chuck provided on each of the compartments for holding and spin-rotating the substrate delivered by the main arm mechanism;

a cup for surrounding the spin chuck to receive and discharge a treatment solution separated from the substrate by centrifugal force;

a common nozzle for supplying the treatment solution toward the substrate held by the spin chuck in the compartment;

a vertical nozzle moving passageway provided along the multistage spin unit for communicating with each of the compartments to move the common nozzle therethrough;

a nozzle moving mechanism for moving the common nozzle in a vertical direction in the nozzle moving passageway;

a clean air introducing mechanism provided in an upper portion of each of the compartments for introducing clean air into each of the compartments;

a dividing member having an opening for letting the common nozzle in and out, and dividing the nozzle moving passageway from the compartment; and an exhaust mechanism for exhausting the nozzle moving passageway.

2. A system according to claim 1, wherein the multistage spin unit has compartments stacked in at least three stages or more, each compartment being provided with a developing device for developing a latent image pattern applied to the substrate.

3. A system according to claim 2, wherein a rinse nozzle for supplying a rinse solution to the substrate is provided in each compartment.

4. A system according to claim 1, further comprising a collecting drain device communicating with each of the cups through a drain passageway, and a collecting exhaust device communicating with each cup through an exhaust passageway.

5. A system according to claim 4, further comprising an opening/closing valve provided on the exhaust passageway and a controller for controlling an operation of the opening/closing valve in such a manner that exhaust timings of the cups do not overlap each other.

6. A system according to claim 1, wherein the nozzle moving mechanism comprises an elevator mechanism for moving the shared nozzle along the nozzle moving passageway, and a swinging and turning mechanism for swinging and turning the shared nozzle around a vertical shaft.

7. A system according to claim 1, further comprising a heating unit having a hot plate provided apart from the multistage spin unit for heating the substrate, and a cooling unit provided below the heating unit for cooling the substrate.

8. A system according to claim 1, wherein the spin chuck which comprises a spin motor, said spin motor having a first length in a direction of a rotation drive axis is less than one-half a second length of a conventional motor in a direction of the rotation axis, and the spin motor has a reduced a thickness in a vertical direction of the cup.

* * * * *